United States Patent
Peterson et al.

(10) Patent No.: US 7,085,549 B2
(45) Date of Patent: Aug. 1, 2006

(54) DYNAMIC POWER SHARING ZERO INTERMEDIATE FREQUENCY (ZIF) MIXER AND METHOD OF FORMING SAME

(75) Inventors: Vance H. Peterson, Boca Raton, FL (US); Daniel Edward Brueske, Fort Lauderdale, FL (US)

(73) Assignee: Motorola, Inc., Schaumburg, IL (US)

( * ) Notice: Subject to any disclaimer, the term of this patent is extended or adjusted under 35 U.S.C. 154(b) by 427 days.

(21) Appl. No.: 10/331,219

(22) Filed: Dec. 30, 2002

(65) Prior Publication Data

US 2004/0127187 A1 Jul. 1, 2004

(51) Int. Cl.
*H04B 1/26* (2006.01)
(52) U.S. Cl. ............... 455/323; 455/313; 455/314; 455/319; 455/216; 327/355; 327/116
(58) Field of Classification Search ............... 455/323, 455/5–20.05, 313, 314, 315, 318, 326, 319, 455/324, 325, 333, 550.1, 575.1, 424, 425, 455/561, 337, 338, 226.1, 260, 259, 316, 455/118, 189.1, 190.1, 196.1, 216, 206, 207, 455/22, 131; 375/329, 331, 332, 376, 327, 375/324, 345, 316, 328, 334, 335; 327/116, 327/113, 114, 355–357; 370/342, 320, 310, 370/319
See application file for complete search history.

(56) References Cited

U.S. PATENT DOCUMENTS

| | | | | |
|---|---|---|---|---|
| 6,282,413 B1 * | 8/2001 | Baltus | .................. | 455/260 |
| 6,510,185 B1 * | 1/2003 | Lee et al. | .................. | 375/327 |
| 6,876,844 B1 * | 4/2005 | Wong | .................. | 455/316 |
| 2003/0222702 A1 * | 12/2003 | Bjork et al. | .................. | 327/355 |

* cited by examiner

*Primary Examiner*—Edward F. Urban
*Assistant Examiner*—Charles Chow

(57) ABSTRACT

A zero intermediate frequency (ZIF) radio frequency (RF) digital mixer (200) includes a low noise amplifier (LNA) (203), a first RF mixer stage (205) for mixing an RF signal from the at least one LNA with a first local oscillator signal operating a first predetermined frequency. A second RF mixer stage (207) is then utilized for mixing in-phase (I) and quadrature (Q) digital signals from the first RF mixer stage (205) with a plurality of second local oscillator signals (LO) operating at a second predetermined frequency. The invention significantly improves current drain by eliminating the need for a linear transconductance stage while still maintaining high degrees of isolation and linearity.

20 Claims, 2 Drawing Sheets

-PRIOR ART-

FIG. 3

DYNAMIC POWER SHARING ZERO INTERMEDIATE FREQUENCY (ZIF) MIXER AND METHOD OF FORMING SAME

TECHNICAL FIELD

This invention relates in general to radio frequency (RF) receivers and more particularly to down conversion RF mixers used with the front-end receiver.

BACKGROUND

In the past few years, the growing demand for low voltage, low power, low cost, high performance mobile communications equipment has changed the way wireless receivers are designed. BiCMOS technology has become a practical contender for use in receiver design, especially because it lends itself to easier integration with digital integrated circuits (ICs), as well as analog circuits. However, usage of submicron ceramic metal-oxide semi-conductor (CMOS) technologies imposes an upper limit on the supply voltages, therefore it is important to focus on low voltage design when designing RF CMOS circuits. Low voltage designs also reduce the average current drain for digital integrated circuits. However, this may not always have the same application to analog circuitry. Moreover, communication products are becoming increasingly complex. By improving on existing circuitry and systems, a reduction in power consumption will enable the operation of ever more complicated communication products without sacrificing product battery life performance. Most modem mixers used in current wireless receivers are based on the classical Gilbert cell. However, one improvement that can always be made to present Gilbert cell designs is a reduction in current drain.

As seen in prior art FIG. 1, a typical Gilbert cell mixer 100 generally located at the front-end of a zero intermediate frequency (ZIF) receiver includes an input 101 that typically feeds into a low noise amplifier (LNA) 103. The LNA 103 is used to amplify the input signal without generating an inordinate amount of noise and distortion signals. This enables the receiver to maintain a significantly high signal-to-noise ratio (SNR). The output of the LNA 103 is fed in a differential fashion to the inputs of transconductance amplifier 105 and transconductance amplifier 107. Both transconductance amplifiers 105, 107 are linear gain stages that provide a high degree of gain while isolating an in-phase (I) and quadrature (Q) local oscillator (LO) mixer input signals 113, 117 from interfering with the output of LNA 103. Without these stages the LO signals 113, 117 can degrade receiver performance by introducing imbalance between I signal 121, Q signal 123, and by creating DC offsets. As is known in the art, the transconductance amplifier is used to convert the RF input voltage into a current. The output of the transconductance amplifiers 105, 107 are then directed to an in-phase LO driven Gilbert cell mixer 109 and a quadrature LO driven Gilbert mixer cell 111. They work with a local oscillator input signals 113, 117 to mix each respective RF input signal from transconductance stages 105, 107 to produce in-phase (I) and quadrature (Q) output signals 121, 123. The local oscillator signals 113 and 117 for the first Gilbert cell mixer 109 and second Gilbert cell mixer 111 are generated by an RF oscillator operating at two times (2×) the oscillator frequency. This is accomplished by operating a voltage controlled oscillator (VCO) 115 whose output duty cycle is 50% with a divide by two circuit producing two local oscillator (LO) signals for both in-phase (I) and quadrature (Q) inputs 113 ($LO_i$) and 117 ($LO_q$). The $LO_i$ and $LO_q$ are then mixed with the input RF signal where they are mixed down to a lower intermediate frequency (IF) or baseband to provide an in-phase (I) output signal 121 and a quadrature (Q) output signal 123.

One major drawback associated with this type of mixer topology is the high current drain required in the transconductance stages 105, 107. When placed on-chip these stages operate with a high degree of isolation and linearity, however this comes at the cost of high power consumption or current drain. Obviously this plays a critical role by ultimately shortening the operating time of any portable battery operated device. If the output of the LNA 103 were connected directly to the input of each respective mixer by removing the transconductance stages, there would be an inadequate amount of isolation between the various mixing signals and would be detrimental to receiver performance. However, this would reduce the current drain substantially. Thus, the need exists to innovate an alternative mixer topology that reduces the current drain by removing the transconductance stages while maintaining a high degree of in-phase and quadrature IF isolation and linearity.

SUMMARY OF THE INVENTION

Briefly, according to the invention, there is provided a two Gilbert cell mixer circuit generally used in a zero intermediate frequency (ZIF) receiver operating without typical linear amplification stages. The invention includes a low noise amplifier (LNA), voltage controlled oscillator (VCO) operating at twice the desired local oscillator (LO) frequency with 50% duty cycle on output signal, a divide by two stage to generate the in-phase and quadrature LO signals, a low current drain highly linear dynamic power splitter which provides a high degree of isolation between in-phase (I) and quadrature (Q) LO signals.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

FIG. 3 is a block diagram of a Gilbert cell mixer of FIG. 2 showing operation of the dynamic power transfer circuit according to the preferred embodiment of the invention.

DETAILED DESCRIPTION OF THE PREFERRED EMBODIMENT

Figure 1:
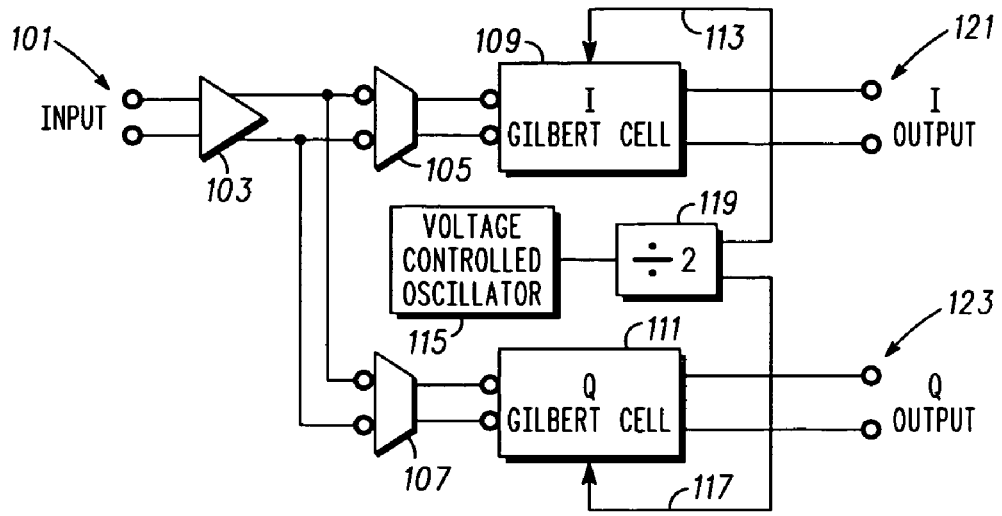
FIG. 1 is a block diagram of a prior art radio frequency (RF) receiver front-end using a low noise amplifier (LNA) and transconductance stages.

While the specification concludes with claims defining the features of the invention that are regarded as novel, it is believed that the invention will be better understood from a consideration of the following description in conjunction with the drawing figures, in which like reference numerals are carried forward.

Figure 2:
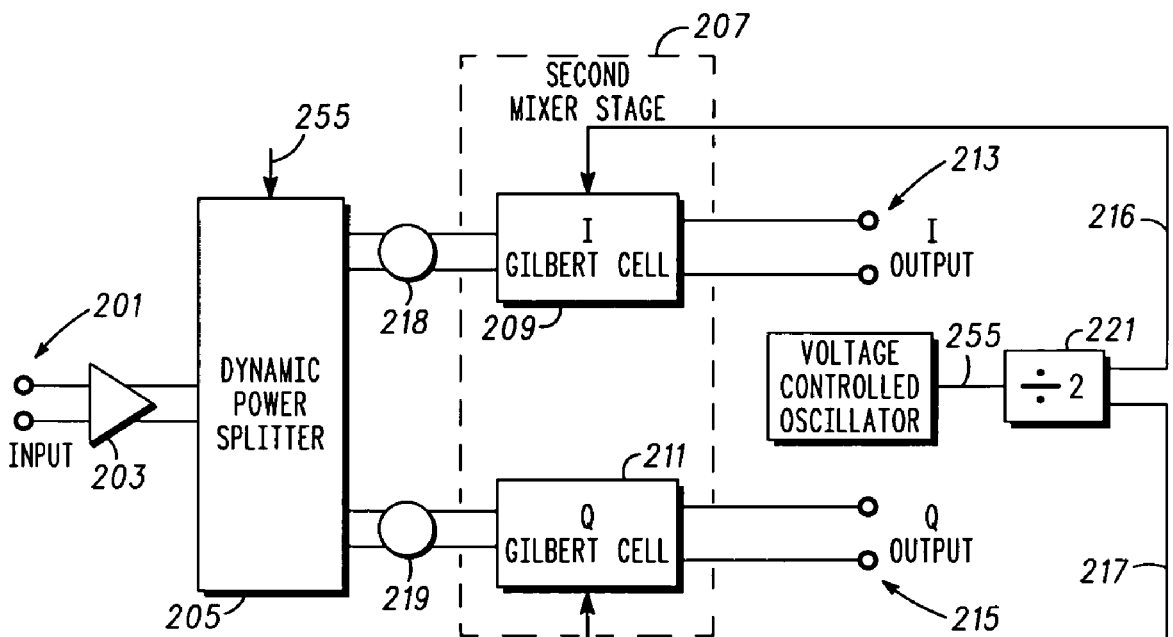
FIG. 2 is a block diagram of a Gilbert cell mixer according to the preferred embodiment of the invention where the transconductance stage has been eliminated.

Referring now to FIG. 2, a RF front-end zero intermediate frequency (ZIF) mixer 200 according to the preferred embodiment of the invention includes an RF input 201 that provides an RF input signal to a low noise amplifier (LNA) 203. The LNA 203 is used to provide a high degree of signal gain while introducing little or no noise and/or spurious signal components to the amplified signal. A first mixer stage 205 is used to dynamically split the power of the RF output signal from the LNA 203 into two signals 218, 219. This is accomplished by using a uniquely configured switch in the first mixer stage 205 which is driven by a voltage controlled oscillator (VCO) signal 255 operating at two times (2×) a predetermined local oscillator frequency (2×LO). It is essential that the VCO output signal 255 be conditioned with a 50% duty cycle; i.e. the signal is in a "high" state for the same duration it is in a "low" state. This fits well into the system because the divide by two quadrature generator will require this condition as well. Thus, the invention will require no additional modifications to the combined VCO and quadrature generating circuitry.

The output of the divide-by-two circuit 221 provides both in-phase (I) and quadrature (Q) signal components 216, 217 respectively, that are provided to a second mixer stage 207. The second mixer stage 207 is configured with both an in-phase driven Gilbert cell 209 and a quadrature driven Gilbert cell 211 that work to mix the power from signals dynamically split by the first mixer stage 205 with the separate local oscillator signals 216, 217. The second mixer stage 207 provides both an in-phase output signal 213 and quadrature output signal 215 of the down converted RF signal. The down converter frequency called the intermediate frequency (IF) will be equal to the RF frequency minus the LO frequency. For example, a zero IF receiver will have its RF frequency and LO frequency equal to each other.

Figure 3:
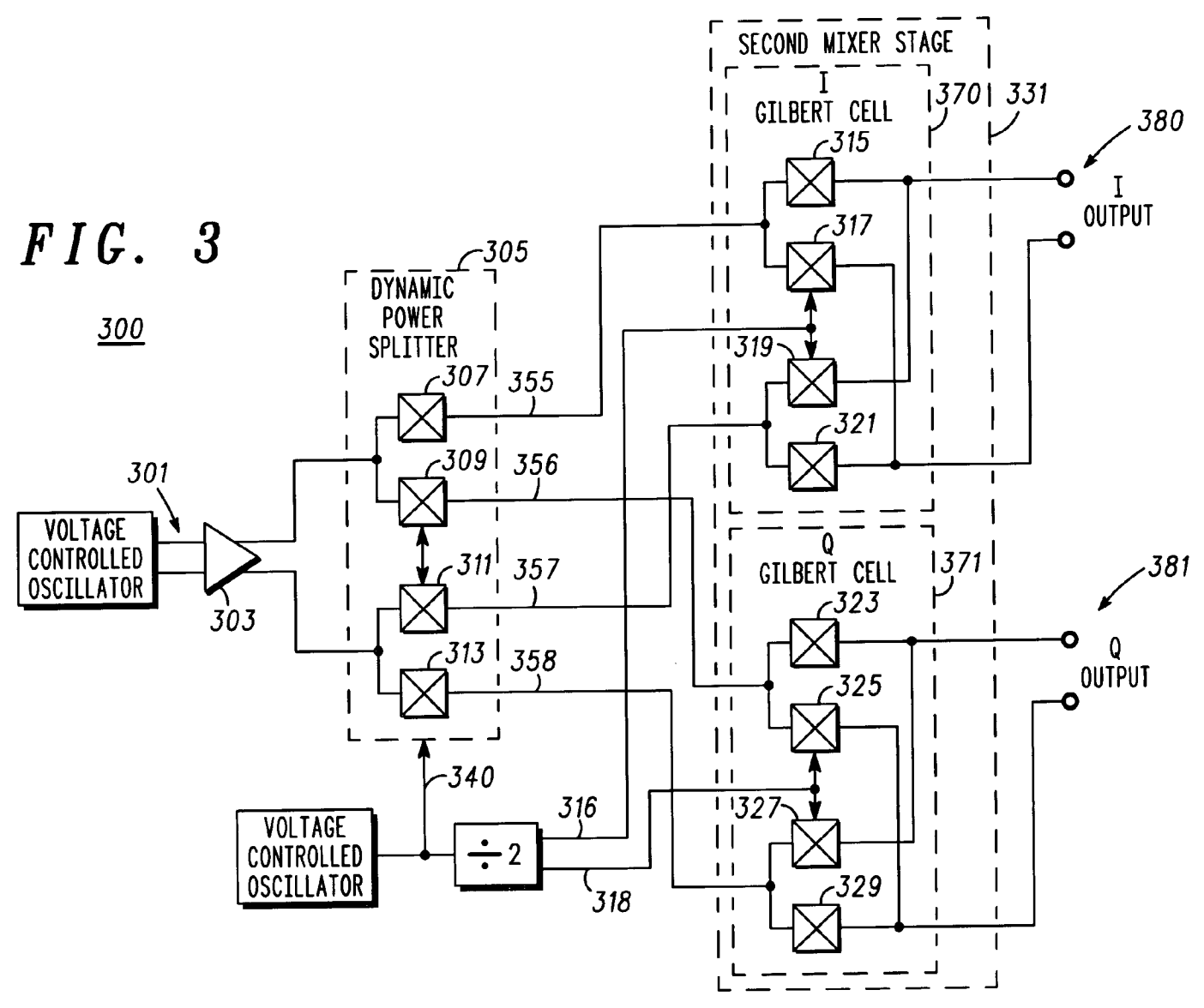

In FIG. 3, specific details of the dynamic power sharing method 300 are illustrated where a radio frequency (RF) input signal 301 is input to a low noise amplifier (LNA) 303 operating to provide high gain while adding no noise or distortion to the components in the amplified signal. As noted in FIG. 2, the output of the LNA 303 is directed to a dynamically power splitting stage 305 which is mixed with the VCO signal which acts as a local oscillator (LO) 340 operating at two-times the frequency provided to the second mixer stage 331 (discussed hereinafter). The dynamic power splitter stage 305 operates using a plurality of switches 307, 309, 311, 313 which work to split the power of the RF input signal to a plurality of outputs 355, 356, 357, 358. The switches 307, 309, 311 and 313 are switched in such a fashion so as to provide a high degree of isolation between the switch outputs 355, 356, 357 and 358. This prevents interference between the two Gilbert cells 370, 371 facilitated by the LO signals 380, 381 in view of the high RF signal amplitude and close proximity on-chip.

The splitter stage 305 operates using switches 307, 309 that alternately pass the LNA output signals 390, 391 to the respective paired switches 315, 317 and 323, 325. When switch 307 is "ON," the signal 390 passes to switch pair 315, 317. During this time switch 309 is "OFF", so there is no continuous connection between Gilbert cell 370, 371. Similarly, when switch 309 is "ON" switch 307 is "OFF" and the signal 390 is passed to Gilbert cell switch pair 323, 325. Switches 311, 313 perform the same function to signal 391 as switches 307, 309. Only the signal 391 is split between switches 319, 321, 327 and 329. As will be recognized by those skilled in the art, the splitter stage 305 requires much less current and can maintain the same linearity as the circuit topology shown in the prior art from FIG. 1. Thus, the splitter stage 305 substantially reduces current drain while maintaining comparable mixer performance.

The second mixer stage 331 includes both an in-phase driven Gilbert cell 370 and quadrature driven Gilbert cell 371 that work to mix the signals provided from the splitter stage 305 with a predetermined local oscillator (LO) signal operating at one-half the VCO frequency. Separate LO signals 316, 318 are provided to the in-phase Gilbert cell 370 and quadrature Gilbert cell 371. Thus, at the input of I Gilbert cell 370 and Q Gilbert cell 371 this may be represented in Equation (1) as:

$$Gil_{in(RF)} = VCO(2 \times LO) - RF; \qquad (1)$$

The in-phase (I) Gilbert cell 370 includes a plurality of switches 315, 317, 319, 321, while the quadrature (Q) Gilbert cell 371 includes switches 323, 325, 327, 329 that work to mix the RF signal from splitter stage 305 with a local oscillator (LO) signal operating at some predetermined frequency to provide an intermediate frequency (IF) signal from the second mixer stage represented by Equation (2):

$$Gil_{out(IF)} = LO - RF \qquad (2)$$

Both the switches in the in-phase Gilbert cell 370 and quadrature Gilbert cell 371 switch in such a fashion as to provide an in-phase (I) output signal 380 and quadrature (Q) output signal 381 at the output of the second mixer stage 331.

As will be recognized by those skilled in the art, the present invention is directed to zero intermediate frequency (ZIF) radio frequency (RF) mixer that includes a dynamic power splitter that eliminates an amplifier transconductance stage for providing gain and isolation. The addition of the dynamic power splitter stage still offers a high degree of isolation between the in-phase and quadrature Gilbert cell mixer signals while providing a high degree of linearity.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A zero intermediate frequency (ZIF) radio frequency (RF) mixer comprising:
   at least one low noise amplifier (LNA);
   a first stage for dynamically sharing, using a splitter comprising a plurality of switches, the RF signal power from the at least one LNA with a first local oscillator (LO) operating at a first predetermined frequency; and
   a second stage for mixing selected signals from the first stage with a plurality of second oscillator (LO) signals operating at a second predetermined frequency.

2. A ZTF RF mixer as in claim 1, wherein the second stage is configured into a plurality of mixer cells.

3. A ZIF RF mixer as in claim 1, wherein the second stage includes an in-phase (I) mixer cell and quadrature (Q) mixer cell that dynamically share power from an RF signal from the first stage.

4. A ZIF RF mixer its in claim 3, wherein the plurality of LO signals are supplied to the in-phase mixer cell and quadrature mixer cell.

5. A ZIF RF mixer as in claim 4, wherein the plurality of switches provide at least four (4) output signals to the second stage.

6. A ZIF RF mixer as in claim 1, wherein the first stage includes a plurality of switches.

7. A ZIF RF mixer as in claim 1, wherein the second stage includes a plurality of switches that provide an in-phase and quadrature output signal.

8. A ZIF RF mixer as in claim 1, wherein the first LO is a voltage controlled oscillator (VCO).

9. A ZIF RF mixer as in claim 8, wherein the plurality of second LO signals are provided by the VCO and at least one divider.

10. A ZIF RF mixer as in claim 1, wherein the second predetermined frequency is one half the first predetermined frequency.

11. A zero intermediate frequency (ZIF) digital radio frequency (RF) mixer configured for dynamic power sharing comprising:

at least one low noise amplifier for amplifying an RF digital input signal;
  a dynamic power sharing stage comprised of a plurality of switches for sharing the output power of the at least one LNA with a First local oscillator (LO) signal operating at a predetermined frequency; and
  a plurality of mixer stages comprised of a plurality of switches for mixing a plurality of output signals from the dynamic power sharing stage with a plurality of second local oscillator (LO) signals operating at one half the predetermined frequency.

12. A ZIF RF mixer as in claim 11, wherein the plurality of mixer stages are comprised of an in-phase (I) mixer cell and a quadrature (Q) mixer cell.

13. A ZIF RF mixer as in claim 11, wherein the dynamic power sharing stage provides at least four (4) output signals to the plurality of mixer stages.

14. A ZIF RF mixer as in claim 11, wherein the first LO signal is provided by a voltage controlled oscillator (VCO) and the plurality of second LO signals are provided by the VCO and a divider.

15. A method for forming a zero intermediate frequency (ZIF) radio frequency (RF) mixer without the use of a transconductance gain stage comprising the steps of:

amplifying an RF input signal with at least one low noise amplifier (LNA);
  dynamically sharing, using a splitter comprising a plurality of switches, the output power of the LNA with a first local oscillator (LO) signal operating at a first predetermined frequency; and
  mixing the output of the power sharing stage in a plurality of mixer stages with a plurality of second local oscillator (LO) signals operating at one half the predetermined frequency to provide an in-phase (I) and quadrature (Q) intermediate frequency (IF) output signal.

16. A method for forming a ZIF RF mixer as in claim 15, wherein the plurality of mixer stages include an in-phase (I) mixer cell and a quadrature (Q) mixer cell.

17. A method for forming a ZIF RF mixer as in claim 15, wherein the step of dynamically sharing output power includes the step of:

equally distributing RF power into the in-phase mixer cell and a quadrature mixer cell.

18. A method for forming a ZIF RF mixer as in claim 15, wherein the step of dynamically sharing includes the step of:

switching the RF input signal to a plurality of output signals using at Least one switch circuit.

19. A method for forming a ZIF RF mixer as in claim 18, wherein the plurality of output signals is four (4).

20. A method for forming a ZIF RF mixer as in claim 15, wherein the first LO signal is provided by a voltage controlled oscillator (VCO) and the plurality of second LO signals are provided by the VCO and at least one divider.

* * * * *